(12) United States Patent
Wang et al.

(10) Patent No.: US 12,388,456 B2
(45) Date of Patent: Aug. 12, 2025

(54) PIPELINE ANALOG-TO-DIGITAL CONVERTER AND CALIBRATION METHOD THEREOF

(71) Applicant: REALTEK SEMICONDUCTOR CORPORATION, Hsinchu (TW)

(72) Inventors: Wei-Jyun Wang, Hsinchu (TW); Kai-Yue Lin, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 202 days.

(21) Appl. No.: 18/381,186

(22) Filed: Oct. 18, 2023

(65) Prior Publication Data

US 2024/0178852 A1   May 30, 2024

(30) Foreign Application Priority Data

Nov. 24, 2022 (TW) .................................. 111145073

(51) Int. Cl.
*H03M 1/12* (2006.01)
*H03M 1/10* (2006.01)

(52) U.S. Cl.
CPC ................................ *H03M 1/1014* (2013.01)

(58) Field of Classification Search
CPC ........ H03M 1/164; H03M 1/44; H03M 3/368; H03M 3/412; H03M 3/422; H03M 3/462; H03M 3/464; H03M 1/002; H03M 1/007; H03M 1/06; H03M 1/0604; H03M 1/0641; H03M 1/0673; H03M 1/1014; H03M 1/1019; H03M 1/1052; H03M 1/109; H03M 1/12; H03M 1/129; H03M 1/183;

(Continued)

(56) References Cited

U.S. PATENT DOCUMENTS 6,967,603 B1 * 11/2005 Lin ...................... H03M 1/1033
                                                        341/120
7,352,306 B2 * 4/2008 Xu ...................... H03M 1/1042
                                                        341/118

(Continued)

OTHER PUBLICATIONS

A. J. Gines, E. J. Peralias and A. Rueda, "Digital background gain error correction in pipeline ADCs," Proceedings Design, Automation and Test in Europe Conference and Exhibition, 2004, pp. 82-87 vol. 1, doi: 10.1109/DATE.2004.1268831.

(Continued)

*Primary Examiner* — Linh V Nguyen
(74) *Attorney, Agent, or Firm* — WPAT, PC

(57) ABSTRACT

A calibration method of a pipeline analog-to-digital converter (ADC) that includes a residue amplifier includes the following steps: (A) generating an offset voltage; (B) adjusting a first input voltage of the residue amplifier according to the offset voltage and a reference digital code; (C) converting an output voltage of the residue amplifier into a second digital code; (D) performing a correlation operation on the reference digital code and the second digital code to generate an intermediate gain; (E) recording the intermediate gain; (F) repeating step (A) to step (E) to record a plurality of intermediate gains; (G) selecting one of the intermediate gains as a digital gain according to the second digital code; and (H) generating an output digital code according to a first digital code, the reference digital code, the digital gain, and the second digital code.

18 Claims, 12 Drawing Sheets

(58) Field of Classification Search
CPC ........ H03M 3/322; H03M 3/39; H03M 3/414; H03M 3/458
USPC .......................... 341/155, 161, 162, 118, 120
See application file for complete search history.

(56) References Cited

U.S. PATENT DOCUMENTS

| | | | |
|---|---|---|---|
| 8,754,794 B1* | 6/2014 | Li | H03M 1/1057 341/161 |
| 8,779,963 B1* | 7/2014 | Bales | H03M 1/007 341/161 |
| 9,281,831 B2* | 3/2016 | Marie | H03M 1/002 |
| 9,438,260 B1* | 9/2016 | Ebata | H03M 1/1038 |
| 9,614,510 B2* | 4/2017 | Srinivasan | H03M 3/386 |
| 9,806,728 B1* | 10/2017 | Sugimoto | H03M 1/0602 |
| 11,218,158 B1* | 1/2022 | Patil | H03M 1/1071 |
| 2006/0077087 A1 | 4/2006 | Moore, Jr. et al. | |
| 2013/0027231 A1* | 1/2013 | Meacham | H03M 1/0641 341/110 |
| 2024/0080033 A1* | 3/2024 | Patil | H03M 1/1047 |
| 2024/0322832 A1* | 9/2024 | Lin | H03M 1/164 |

OTHER PUBLICATIONS

OA letter of a counterpart TW application (appl. No. 111145073) mailed on Sep. 1, 2023. Summary of the TW OA letter in regard to the TW counterpart application: (1) Claim(s) 1, 3-4, 6-8, and 10 is/are rejected under Patent Law Article 22 (2) as allegedly being unpatentable over reference 1 (U.S. Pat. No. 08,779,963 B1) and reference 2 (US 2006/0077087 A1). (2) Claim(s) 2, 5, and 9 are allowed. Claim correspondence between the TW counterpart application and the instant US application:Claims 1-5 and 8-10 in the TW counterpart application correspond to claims 1-5, 6, 10, and 11 in the instant US application, respectively.

\* cited by examiner

PIPELINE ANALOG-TO-DIGITAL CONVERTER AND CALIBRATION METHOD THEREOF

BACKGROUND OF THE INVENTION

1. Field of the Invention

The present invention generally relates to an analog-to-digital converter (ADC), and, more particularly, to a pipeline ADC (also known as a pipelined ADC).

2. Description of Related Art

In a pipeline ADC, there is a residue amplifier between two stages to amplify the residual signal, and the digital code produced in each stage must be multiplied by a multiple related to the magnification of the residue amplifier before combination. However, since the magnification of the amplifier may vary in mass production, the performance of the overall output of the pipeline ADC will be degraded if the ideal combination multiples are used for calculation.

In addition, the actual magnification GA of the residue amplifier may not be linear, as shown of FIG. 1, which shows a relationship between the actual magnification GA of the residue amplifier and the residual voltage Vres. The non-linear magnification GA seriously affects the performance of the overall output of the pipeline ADC.

SUMMARY OF THE INVENTION

In view of the issues of the prior art, an object of the present invention is to provide a pipeline analog-to-digital converter (ADC) and a calibration method thereof, so as to make an improvement to the prior art.

According to one aspect of the present invention, a pipeline ADC is provided. The pipeline ADC includes an offset voltage generation circuit, a first ADC, a first digital-to-analog converter (DAC), a second DAC, a first adder circuit, a residue amplifier, a second ADC, a correlation circuit, a digital gain determination circuit, and an output circuit. The offset voltage generation circuit is configured to generate an offset voltage. The first ADC is configured to generate a first digital code according to an input voltage and the offset voltage. The first DAC is configured to generate a first intermediate voltage according to the first digital code. The second DAC is configured to generate a reference voltage according to a reference digital code. The first adder circuit is configured to generate a second intermediate voltage according to the input voltage, the first intermediate voltage, and the reference voltage. The residue amplifier is configured to amplify the second intermediate voltage to generate a third intermediate voltage. The second ADC is configured to generate a second digital code according to the third intermediate voltage. The correlation circuit is configured to generate a plurality of intermediate gains according to the reference digital code and the second digital code. The digital gain determination circuit is configured to select one of the intermediate gains as a digital gain according to the second digital code. The output circuit is configured to generate an output digital code according to the first digital code, the reference digital code, the second digital code, and the digital gain.

According to another aspect of the present invention, a pipeline ADC is provided. The pipeline ADC includes an offset voltage generation circuit, a first ADC, a first DAC, a second DAC, a first adder circuit, a residue amplifier, a second ADC, a correlation circuit, a digital gain determination circuit, and an output circuit. The offset voltage generation circuit is configured to generate an offset voltage. The first ADC is configured to generate a first digital code according to an input voltage. The first DAC is configured to generate a first intermediate voltage according to the first digital code. The second DAC is configured to generate a reference voltage according to a reference digital code. The first adder circuit is configured to generate a second intermediate voltage according to the input voltage, the first intermediate voltage, the offset voltage, and the reference voltage. The residue amplifier is configured to amplify the second intermediate voltage to generate a third intermediate voltage. The second ADC is configured to generate a second digital code according to the third intermediate voltage. The correlation circuit is configured to generate a plurality of intermediate gains according to the reference digital code and the second digital code. The digital gain determination circuit is configured to select one of the intermediate gains as a digital gain according to the second digital code. The output circuit is configured to generate an output digital code according to the first digital code, the reference digital code, the second digital code, and the digital gain.

According to still another aspect of the present invention, a pipeline ADC is provided. The pipeline ADC includes an offset digital code generation circuit, a first ADC, a first DAC, a second DAC, a first adder circuit, a residue amplifier, a second ADC, a correlation circuit, a digital gain determination circuit, and an output circuit. The offset digital code generation circuit is configured to generate an offset digital code. The first ADC is configured to generate a first digital code according to an input voltage. The first DAC is configured to generate a first intermediate voltage according to the first digital code. The second DAC is configured to generate an offset voltage according to a reference digital code and the offset digital code. The first adder circuit is configured to generate a second intermediate voltage according to the input voltage, the first intermediate voltage, and the offset voltage. The residue amplifier is configured to amplify the second intermediate voltage to generate a third intermediate voltage. The second ADC is configured to generate a second digital code according to the third intermediate voltage. The correlation circuit is configured to generate a plurality of intermediate gains according to the reference digital code and the second digital code. The digital gain determination circuit is configured to select one of the intermediate gains as a digital gain according to the second digital code. The output circuit is configured to generate an output digital code according to the first digital code, the reference digital code, the offset digital code, the second digital code, and the digital gain.

According to still another aspect of the present invention, a method of calibrating a pipeline ADC that includes a residue amplifier is provided. The method includes the following steps: (A) generating an offset voltage; (B) adjusting a first input voltage of the residue amplifier according to the offset voltage and a reference digital code; (C) converting an output voltage of the residue amplifier into a second digital code; (D) performing a correlation operation on the reference digital code and the second digital code to generate an intermediate gain; (E) recording the intermediate gain; (F) repeating steps (A) to (E) to record a plurality of intermediate gains; (G) selecting one of the intermediate gains as a digital gain according to the second digital code; and (H) generating an output digital code according to a first digital code, the reference digital code, the digital gain, and the second digital code.

The technical means embodied in the embodiments of the present invention can solve at least one of the problems of the prior art. Therefore, compared to the prior art, the present invention can improve the overall linearity of the pipeline ADC.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes a pipeline analog-to-digital converter (ADC) and a calibration method thereof. On account of that some or all elements of the pipeline ADC could be known, the detail of such elements is omitted provided that such detail has little to do with the features of this disclosure, and that this omission nowhere dissatisfies the specification and enablement requirements. Some or all of the processes of the calibration method of the pipeline ADC may be implemented by software and/or firmware, and can be performed by the pipeline ADC or its equivalent. A person having ordinary skill in the art can choose components or steps equivalent to those described in this specification to carry out the present invention, which means that the scope of this invention is not limited to the embodiments in the specification.

Figure 2:
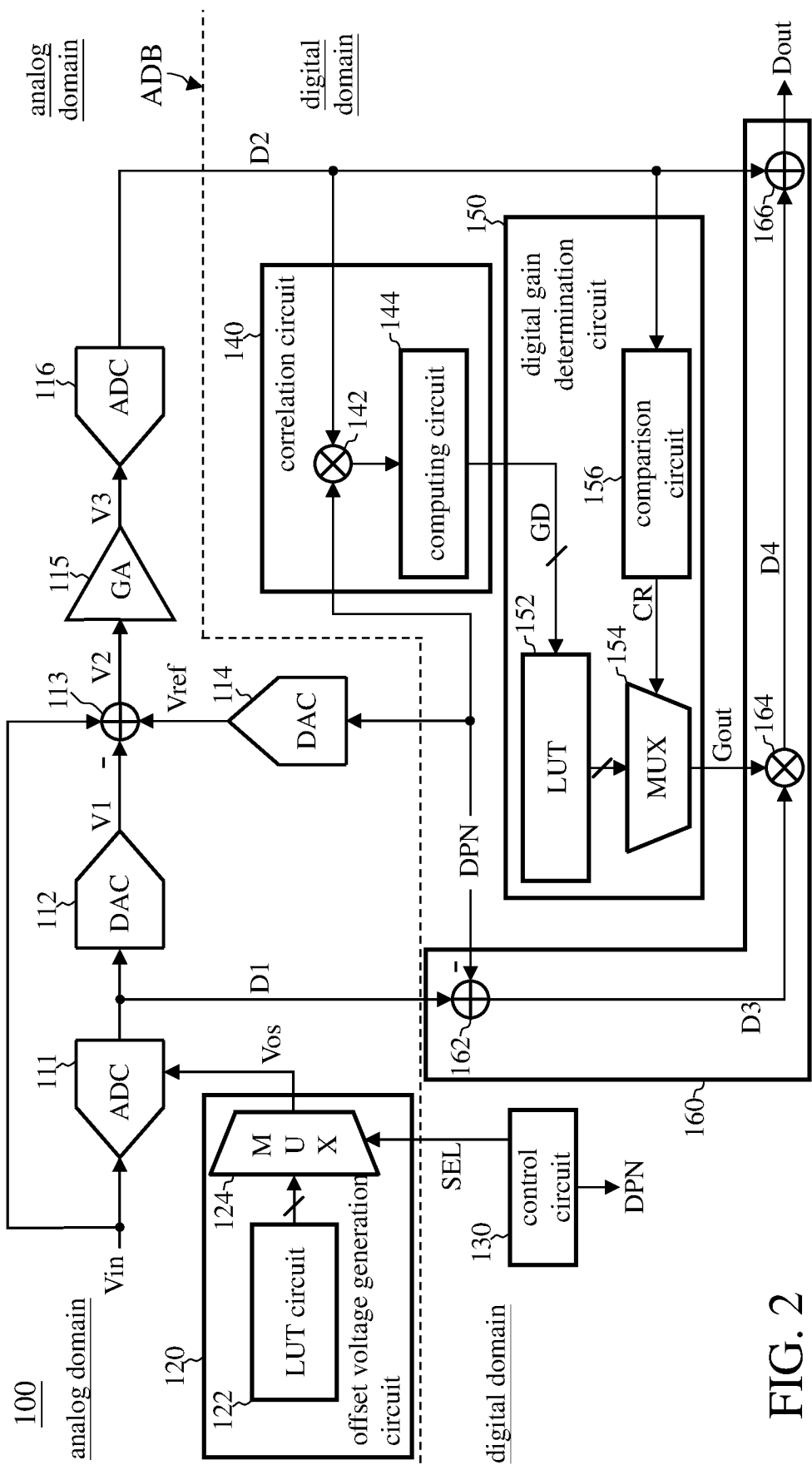
FIG. 2 is a functional block diagram of a pipeline analog-to-digital converter (ADC) according to an embodiment of the present invention.

FIG. 2 is a functional block diagram of a pipeline ADC according to an embodiment of the present invention. The pipeline ADC 100 includes an ADC 111, a digital-to-analog converter (DAC) 112, an adder circuit 113, a DAC 114, a residue amplifier 115 (with magnification GA), an ADC 116, an offset voltage generation circuit 120, a control circuit 130, a correlation circuit 140, a digital gain determination circuit 150, and an output circuit 160. Above and below the dotted line ADB are the analog domain and the digital domain, respectively. The pipeline ADC 100 receives an input voltage Vin and generates an output digital code Dout.

The ADC 111 is used to generate the digital code D1 according to the input voltage Vin and the offset voltage Vos. The DAC 112 converts the digital code D1 into an intermediate voltage V1. The DAC 114 converts the reference digital code DPN generated by the control circuit 130 into a reference voltage Vref. The adder circuit 113 generates the intermediate voltage V2 according to the input voltage Vin, the intermediate voltage V1, and the reference voltage Vref (V2=Vin+Vref−V1). The residue amplifier 115 amplifies the intermediate voltage V2 to generate an intermediate voltage V3 (V3=V2×GA, where GA is the magnification of the residue amplifier 115). The ADC 116 converts the intermediate voltage V3 into a digital code D2. In some embodiments, the adder circuit can be combined with the DAC 112, the DAC 114, or the ADC 111 in hardware to equivalently perform the voltage addition operation.

The offset voltage generation circuit 120 is controlled by the control circuit 130 to generate the offset voltage Vos. More specifically, the offset voltage generation circuit 120 includes a look-up table (LUT) circuit 122 and a selection circuit 124. In some embodiments, the selection circuit 124 may be a multiplexer (MUX). The LUT circuit 122 generates a plurality of candidate offset voltages, and the control circuit 130 controls, through the selection signal SEL, the selection circuit 124 to output one of the candidate offset voltages as the offset voltage Vos.

The control circuit 130 also generates the reference digital code DPN. The reference digital code DPN is a sequence of pseudo-random numbers (PNs). In some embodiments, the reference digital code DPN is a digital code whose value is substantially random over time. The purpose of generating the reference digital code DPN is to add a known voltage (i.e., the reference voltage Vref) to the input terminal of the residue amplifier 115, and the known voltage is reflected on the digital code D2 (i.e., becomes part of the digital code D2).

The correlation circuit 140 is used for performing a correlation operation on the reference digital code DPN and the digital code D2. The multiplication circuit 142 calculates the product of the reference digital code DPN and the digital code D2, and then the computing circuit 144 calculates the average value of multiple products that correspond to multiple reference digital codes DPN, respectively. The computing circuit 144 then performs a constant correction on the average value to generate an intermediate gain GD. The intermediate gain GD is an estimate of the magnification GA of the residue amplifier 115. Because the magnification GA is non-linear, the estimated intermediate gain GD varies with the offset voltage Vos, that is, the magnitude of the intermediate gain GD is related or corresponding to the magnitude of the offset voltage Vos. Furthermore, since the magnitude of the digital code D2 is also related to the magnitude of the offset voltage Vos, the magnitude of the intermediate gain GD is also related or corresponding to the magnitude of the digital code D2. The mathematical principle of estimating the intermediate gain GD based on the reference digital code DPN can be referred to: A. J. Gines, E. J. Peralias and A. Rueda, "Digital background gain error correction in pipeline ADCs," *Proceedings Design, Automation and Test in Europe Conference and Exhibition*, 2004, pp. 82-87 Vol. 1, doi: 10.1109/DATE.2004.1268831.

The digital gain determination circuit 150 selects, according to the digital code D2, one of the multiple intermediate gains GD (the generation of the multiple intermediate gains GD will be detailed below) as the digital gain Gout. The digital gain Gout is the ratio between the output of the first-stage ADC (i.e., the digital code D1) and the output of the second-stage ADC (i.e., the digital code D2) of the pipeline ADC 100.

More specifically, the digital gain determination circuit 150 includes a LUT 152, a selection circuit 154, and a comparison circuit 156. The LUT 152 stores a plurality of intermediate gains GD. The comparison circuit 156 compares the digital code D2 with a plurality of threshold values to generate a comparison result CR (i.e., the comparison result CR indicates the zone corresponding to the digital code D2; the zones will be detailed below). The selection circuit 154 then outputs, according to the comparison result CR, a corresponding intermediate gain GD as the digital gain Gout. In some embodiments, the LUT 152 can be stored in a memory (not shown), and the selection circuit 154 may be a multiplexer.

The output circuit 160 generates the output digital code Dout according to the digital code D1, the reference digital code DPN, the digital code D2, and the digital gain Gout. More specifically, the output circuit 160 includes an adder circuit 162, a multiplication circuit 164, and an adder circuit 166. The adder circuit 162 generates a digital code D3 according to the digital code D1 and the reference digital code DPN (D3=D1−DPN). The multiplication circuit 164 generates a digital code D4 according to the digital code D3 and the digital gain Gout (D4=D3×Gout). The adder circuit 166 generates the output digital code Dout according to the digital code D4 and the digital code D2 (Dout=D4+D2).

In some embodiments, the correlation circuit 140 and the digital gain determination circuit 150 may be part of the control circuit 130.

Figure 3:
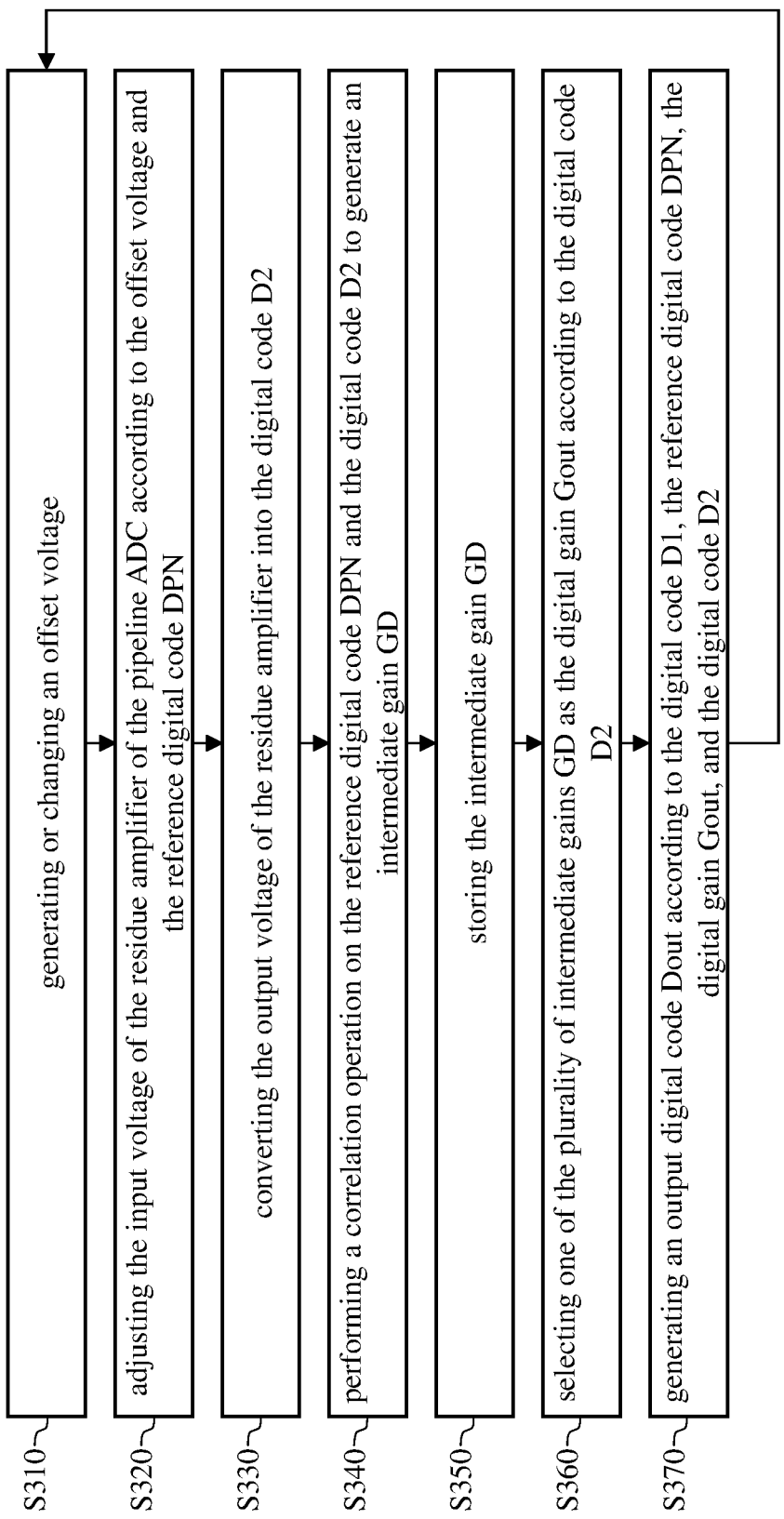
FIG. 3 shows a flowchart of a calibration method for the pipeline ADC according to an embodiment of the present invention.

FIG. 3 shows a flowchart of a calibration method for the pipeline ADC according to an embodiment of the present invention. The flow includes the following steps S310-S370. The flow of FIG. 3 is discussed below in connection with FIG. 2.

Step S310: An offset voltage is generated or changed. In the example of FIG. 2, this step can be performed by the offset voltage generation circuit 120. Steps S310-S370 are repeatedly performed in the background of the normal operation of the pipeline ADC. In some embodiments, each time step S310 is performed, the control circuit 130 controls the offset voltage generation circuit 120 to output a different offset voltage Vos.

Step S320: The input voltage of the residue amplifier 115 of the pipeline ADC 100 is adjusted according to the offset voltage and the reference digital code DPN. In the example of FIG. 2, this step can be performed by applying the offset voltage Vos to the ADC 111, converting the reference digital code DPN into a reference voltage Vref, and then applying the reference voltage Vref to the input terminal of the residue amplifier 115. This will be discussed in more detail below.

Step S330: The ADC 116 converts the output voltage of the residue amplifier 115 (i.e., the intermediate voltage V3) into the digital code D2.

Step S340: The correlation circuit 140 performs a correlation operation on the reference digital code DPN and the digital code D2 to generate an intermediate gain GD.

Step S350: The intermediate gain GD is recorded. In the example of FIG. 2, the intermediate gain GD is stored in the LUT 152.

Step S360: The digital gain determination circuit 150 selects one of the plurality of intermediate gains GD as the digital gain Gout according to the digital code D2. Note that if the LUT 152 stores only one intermediate gain GD (e.g., the flow of FIG. 3 is executed for the first time), then this step uses the intermediate gain GD as the digital gain Gout. If the LUT does not store any intermediate gain (e.g., the device has just been booted and the flow of FIG. 3 has not yet been executed), a preset value can be used as the digital gain Gout.

Step S370: The output circuit 160 generates an output digital code Dout according to the digital code D1, the reference digital code DPN, the digital gain Gout, and the digital code D2.

The above steps are repeated to record multiple intermediate gains GD. In some embodiments, the control circuit 130 controls the above steps to be executed in the background of the pipeline ADC 100; that is to say, the pipeline ADC 100 generates the intermediate gains GD based on different corresponding offset voltages Vos and records the intermediate gains GD while generating the output digital code Dout according to the input voltage Vin.

Figure 4:
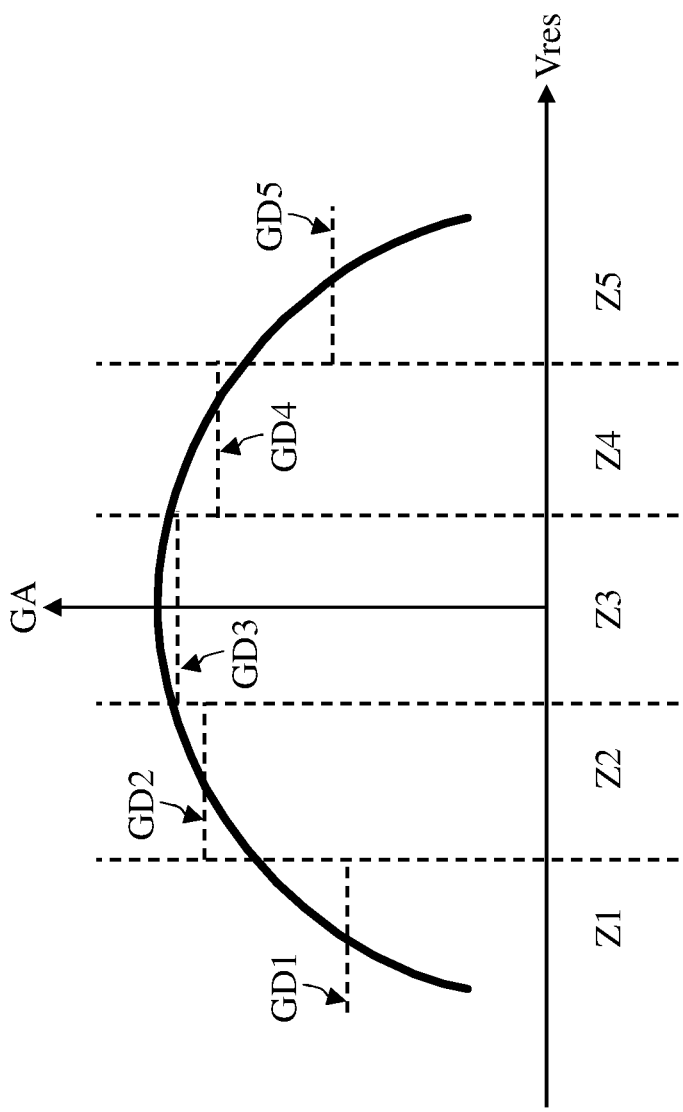
FIG. 4 is the schematic diagram of dividing the residual voltage into multiple zones according to the present invention.

Adding the offset voltage Vos to the circuit preceding the residue amplifier 115 (i.e., the ADC 111, the DAC 112, or the adder circuit 113) causes the residual voltage Vres to change. In some embodiments, the larger (or smaller) the offset voltage Vos, the larger (or smaller) the residual voltage Vres. Reference is made to FIG. 4, which is a schematic diagram of dividing the residual voltage into multiple zones according to the present invention. By adjusting the offset voltage Vos, the correlation circuit 140 generates intermediate gains GD corresponding to different zones. As shown of FIG. 4, the zones Z1 to Z5 correspond to the intermediate gains GD1 to GD5, respectively, and the zones Z1 to Z5 correspond to different ranges of the digital code D2 (where the ranges are determined by multiple threshold values of the comparison circuit 156). That is to say, the digital gain Gout of the pipeline ADC 100 is not a fixed value, but is determined by the digital gain determination circuit 150 according to the digital code D2, and the digital code D2 is related to the residual voltage Vres of the first-stage ADC. Thus, the output digital code Dout of the pipeline ADC 100 has taken into account the non-linear characteristics of the residue amplifier 115 (which is equivalent to calibrating the non-linearity of the residue amplifier 115), so the overall output of the pipeline ADC 100 (i.e., the output digital code Dout) becomes more correct.

In some embodiments, the threshold value can be determined by observing the average value of the digital code D2. For example, it is assumed that the maximum output range of the digital code D2 is 0 to 255, and the range of the digital code D2 is 64 to 192 during normal operation where the offset voltage Vos has not been added, then the gain that the correlation circuit 140 estimates at this time is the intermediate gain GD3. Then, the range of the digital code D2 changes, for example, to 94 to 222 (the zone Z4) after a certain target offset voltage Vos is added, and the gain that the correlation circuit 140 estimates at this time is the intermediate gain GD4. As a result, since the target offset voltage Vos will probably cause a shift of 30 digital codes at the ADC 116, the zone from 127.5-15 to 127.5+15 can be determined to be the zone Z3. By repeating the flow of FIG. 3, the intermediate gains corresponding to other zones can be finally determined.

The above threshold values that define the zones can be preset through the simulation parameters in the design phase, or determined by observing the change of the digital code D2 during the execution of the flow of FIG. 3. In some embodiments, when the number of added target offset voltages is greater than two or more, the gaps between the offset voltages can be designed unequal according to the linearity requirements of the amplifier, and with appropriately designed threshold values, the linearity performance of the ADC can be improved.

Figure 1:
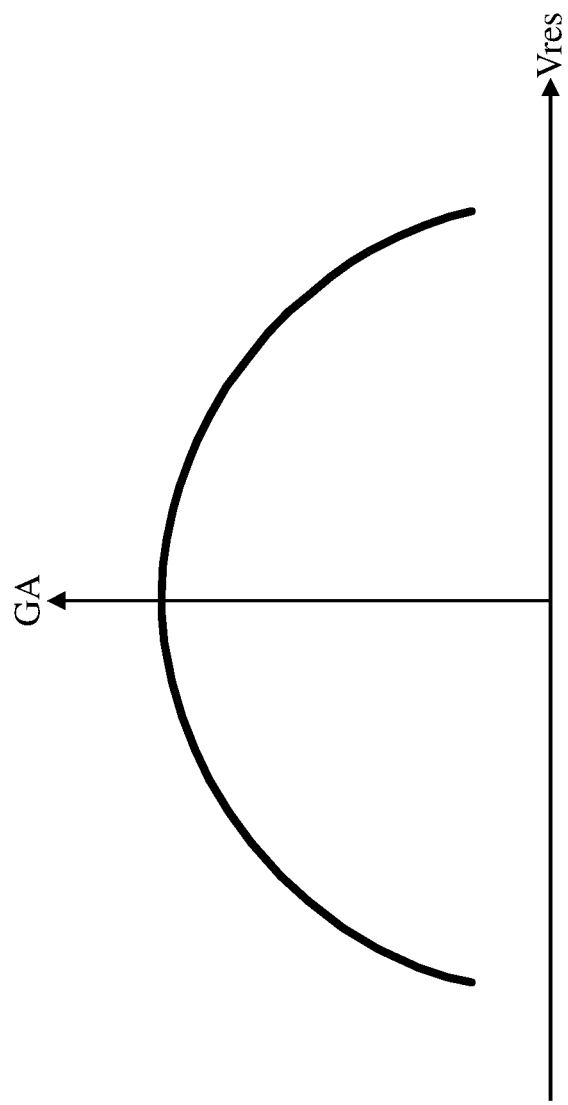
FIG. 1 shows a relationship between the actual magnification GA of the residue amplifier and the residual voltage Vres.
Figure 5:
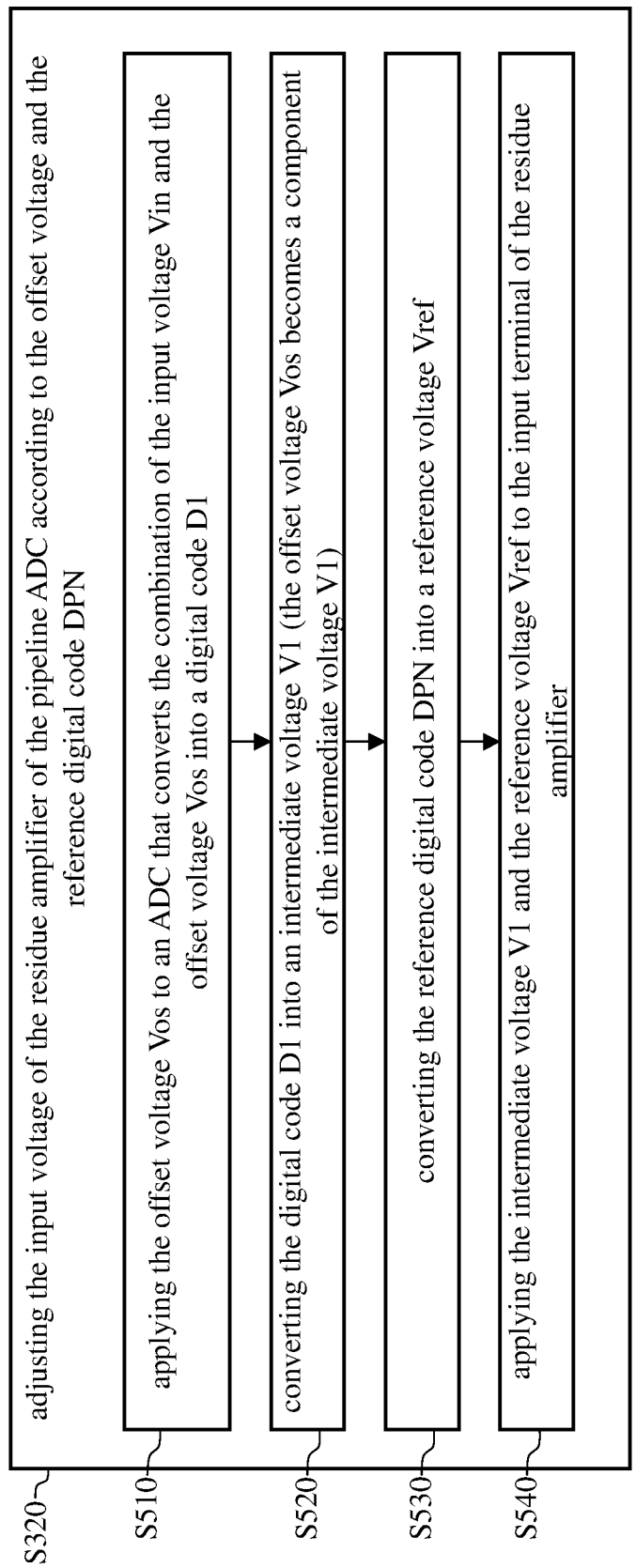
FIG. 5 shows the detail of step S320 of FIG. 1 according to an embodiment.

FIG. 5 shows the detail of step S320 of FIG. 1 according to an embodiment. Step S320 includes the following sub-steps.

Figure 6:
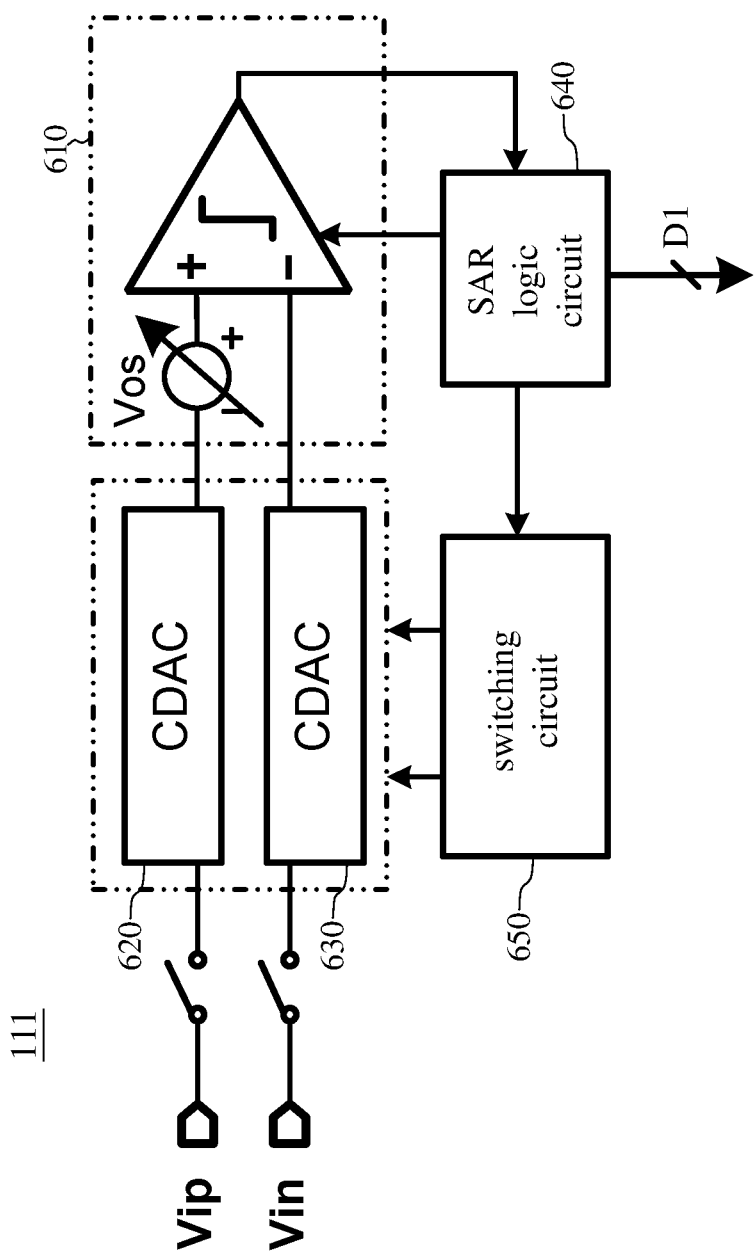
FIG. 6 is a functional block diagram of the ADC 111 according to an embodiment.

Step S510: The offset voltage Vos is applied to the ADC 111, and the ADC 111 converts the combination of the input voltage Vin and the offset voltage Vos into a digital code D1. Reference is made to FIG. 6, which is a functional block diagram of the ADC 111 according to an embodiment. In the example of FIG. 6, ADC 111 is a successive-approximation register ADC (SAR ADC), including a comparator 610, a capacitive DAC (referred to as CDAC) 620, a capacitive DAC 630, a SAR logic circuit 640, and a switching circuit 650. The operating principle of the SAR ADC is well known to people having ordinary skill in the art, and the details are thus omitted for brevity. In the example of FIG. 6, an offset voltage Vos is added to the input of the comparator 610.

Step S520: The DAC 112 converts the digital code D1 into an intermediate voltage V1. The magnitude of the offset voltage Vos will be reflected on the digital code D1. That is, the offset voltage Vos becomes a component of the intermediate voltage V1 (i.e., the magnitude of the intermediate voltage V1 is related to the magnitude of the offset voltage Vos).

Step S530: The DAC 114 converts the reference digital code DPN into a reference voltage Vref.

Step S540: The intermediate voltage V1 and the reference voltage Vref are applied to the input terminal of the residue amplifier 115 through the adder circuit 113.

Figure 7:
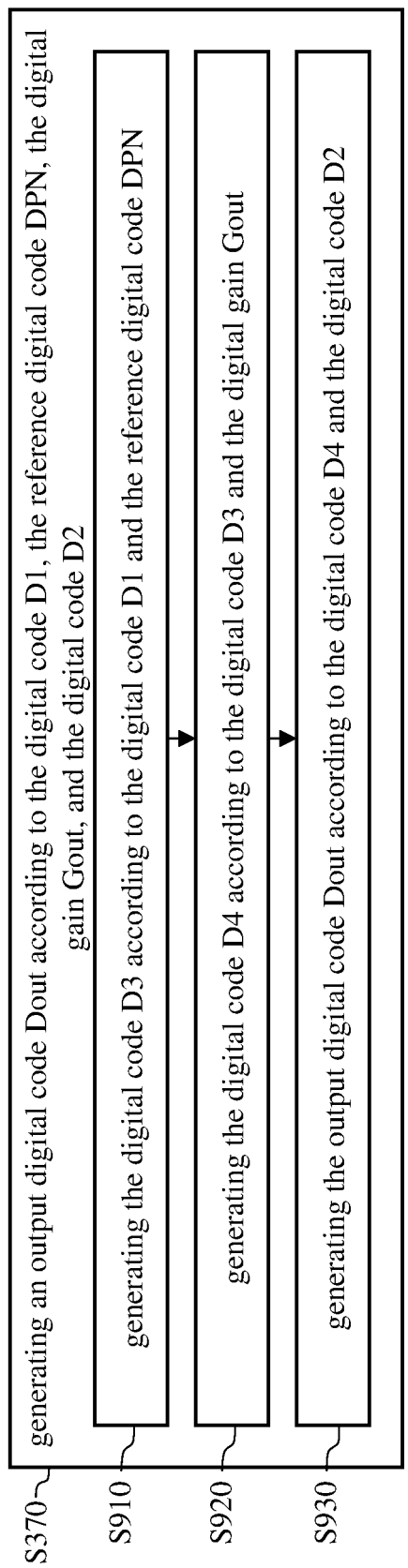
FIG. 7 shows the detail of step S370 of FIG. 3 according to an embodiment.

FIG. 7, which corresponds to FIG. 2, shows the detail of step S370 of FIG. 3 according to an embodiment. Step S370 includes the following sub-steps.

Step S910: The adder circuit 162 generates the digital code D3 according to the digital code D1 and the reference digital code DPN.

Step S920: The multiplication circuit 164 generates the digital code D4 according to the digital code D3 and the digital gain Gout.

Step S930: The adder circuit 166 generates the output digital code Dout according to the digital code D4 and the digital code D2.

Figure 8:
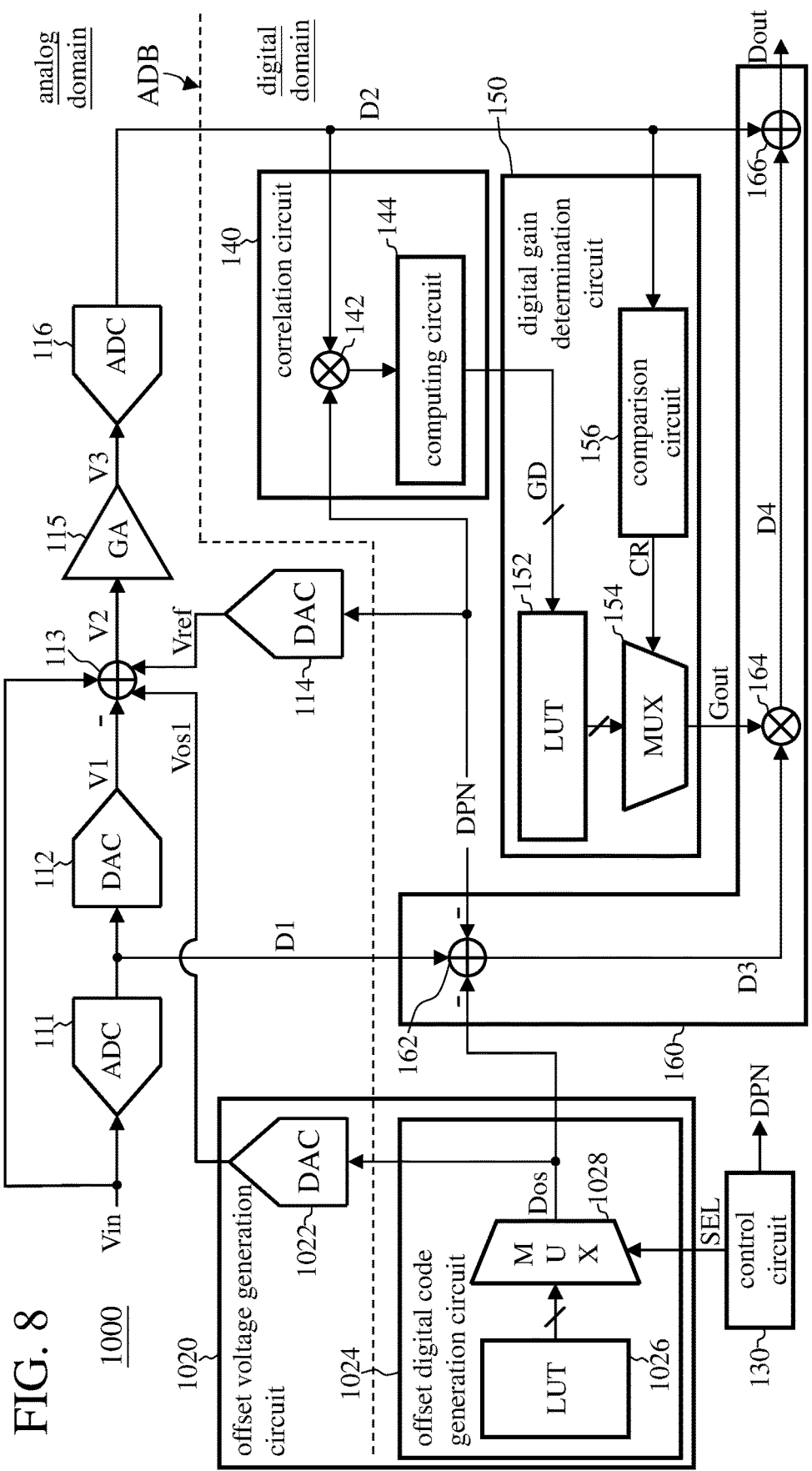
FIG. 8 is a functional block diagram of a pipeline ADC according to another embodiment of the present invention.

FIG. 8 is a functional block diagram of a pipeline ADC according to another embodiment of the present invention. The pipeline ADC 1000 is similar to the pipeline ADC 100 of FIG. 2, except that the offset voltage generation circuit 1020 of the pipeline ADC 1000 is different from the offset voltage generation circuit 120 of FIG. 2, and that the adder circuit 113 and the adder circuit 162 of the pipeline ADC 1000 are slightly different from the adder circuit 113 and the adder circuit 162 of the pipeline ADC 100, respectively.

The offset voltage generation circuit 1020 includes a DAC 1022 and an offset digital code generation circuit 1024. The offset digital code generation circuit 1024 includes a LUT 1026 and a selection circuit 1028. In some embodiments, the LUT 1026 can be stored in a memory (not shown), and the selection circuit 1028 can be a multiplexer. The LUT 1026 stores a plurality of candidate offset digital codes, and the control circuit 130 controls, through the selection signal SEL, the selection circuit 1028 to output one of the candidate offset digital codes as the offset digital code Dos. The DAC 1022 converts the offset digital code Dos into an offset voltage Vos1. The adder circuit 113 generates an intermediate voltage V2 according to the input voltage Vin, the intermediate voltage V1, the offset voltage Vos1, and the reference voltage Vref (V2=Vin−V1+Vos1+Vref). The adder circuit 162 generates the digital code D3 according to the digital code D1, the reference digital code DPN, and the offset digital code Dos (D3=D1−Dos−DPN).

The process of FIG. 3 is also applicable to the circuit of FIG. 8, but the details of step S320 and step S330 are slightly different, as explained below.

Figure 9:
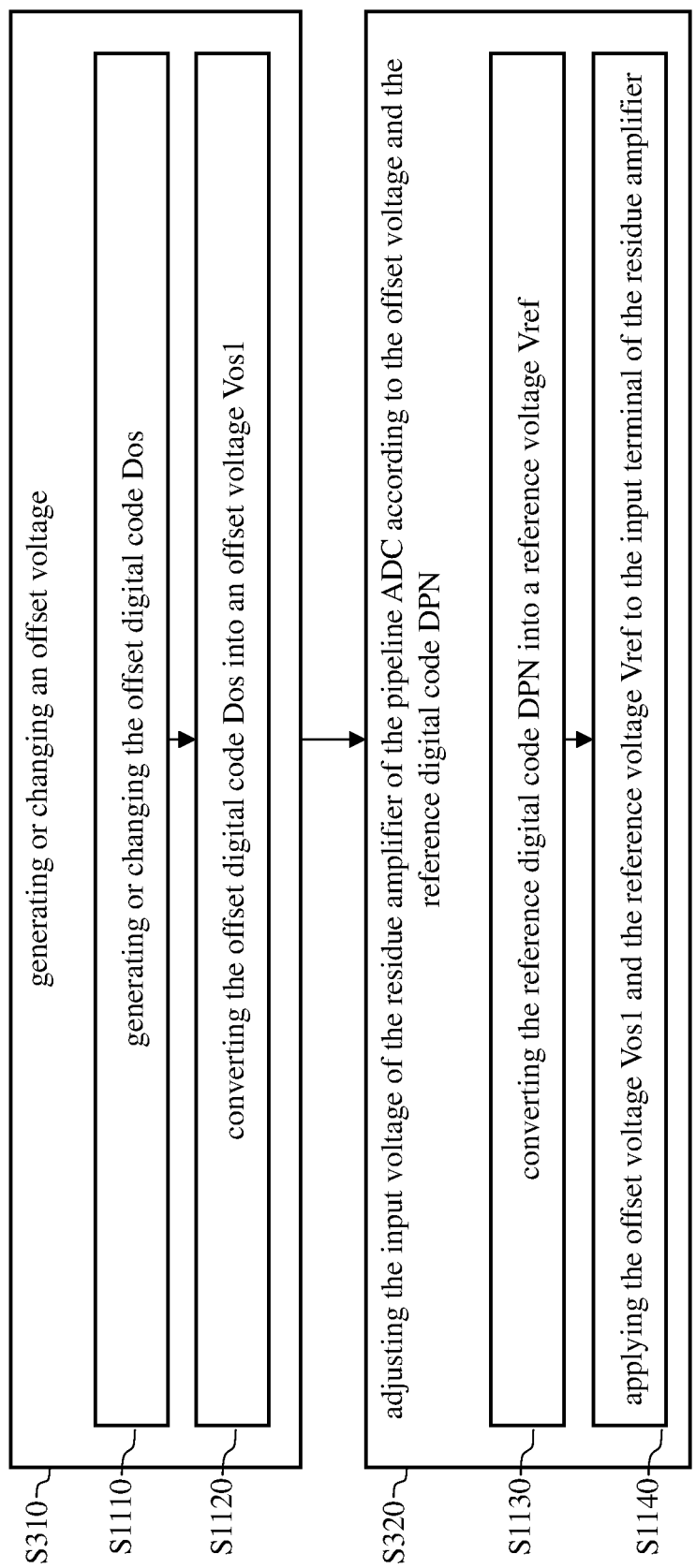
FIG. 9 shows the details of step S310 and step S320 of FIG. 3 according to another embodiment.

FIG. 9, which corresponds to the circuit of FIG. 8, shows the details of step S310 and step S320 of FIG. 3 according to another embodiment. Step S310 includes the following sub-steps.

Step S1110: The offset digital code generation circuit 1024 generates or changes the offset digital code Dos. Similar to the offset voltage generation circuit 120, in some embodiments, the control circuit 130 controls the offset digital code generation circuit 1024 to output a different offset digital code Dos each time the step S1110 is performed.

Step S1120: the DAC 1022 converts the offset digital code Dos into an offset voltage Vos1.

Continue with FIG. 9, step S320 includes the following sub-steps.

Step S1130: The DAC 114 converts the reference digital code DPN into a reference voltage Vref.

Step S1140: The offset voltage Vos1 and the reference voltage Vref are applied to the input terminal of the residue amplifier 115 through the adder circuit 113.

Figure 10:
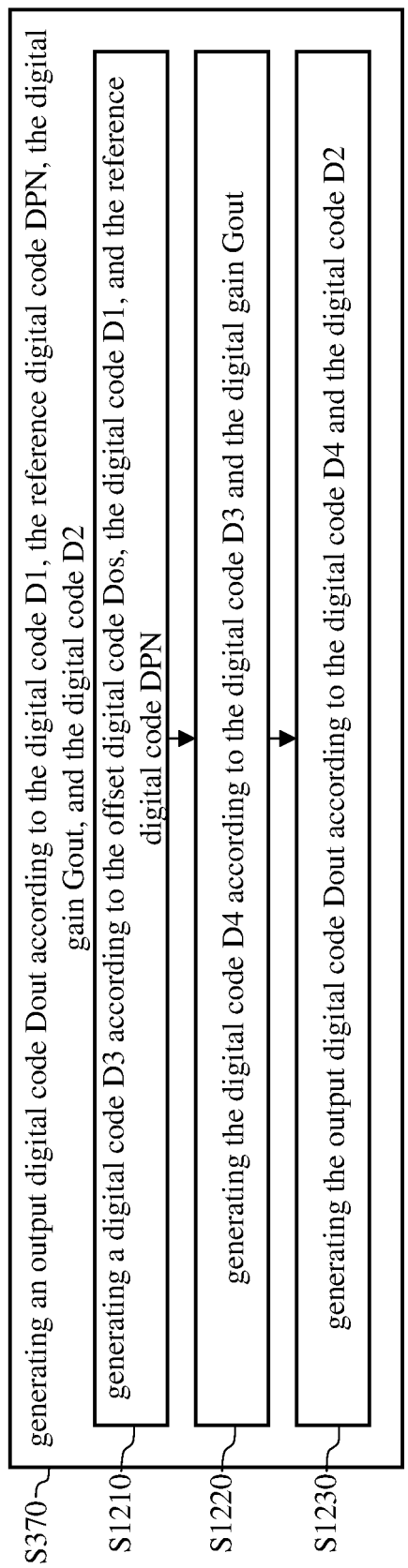
FIG. 10 shows the detail of step S370 of FIG. 3 according to another embodiment.

FIG. 10, which corresponds to the circuit of FIG. 8, shows the detail of step S370 of FIG. 3 according to another embodiment. Step S370 includes the following sub-steps.

Step S1210: The adder circuit 162 generates a digital code D3 according to the offset digital code Dos, the digital code D1, and the reference digital code DPN.

Step S1220 and step S1230 are the same as step S920 and step S930 respectively.

Figure 11:
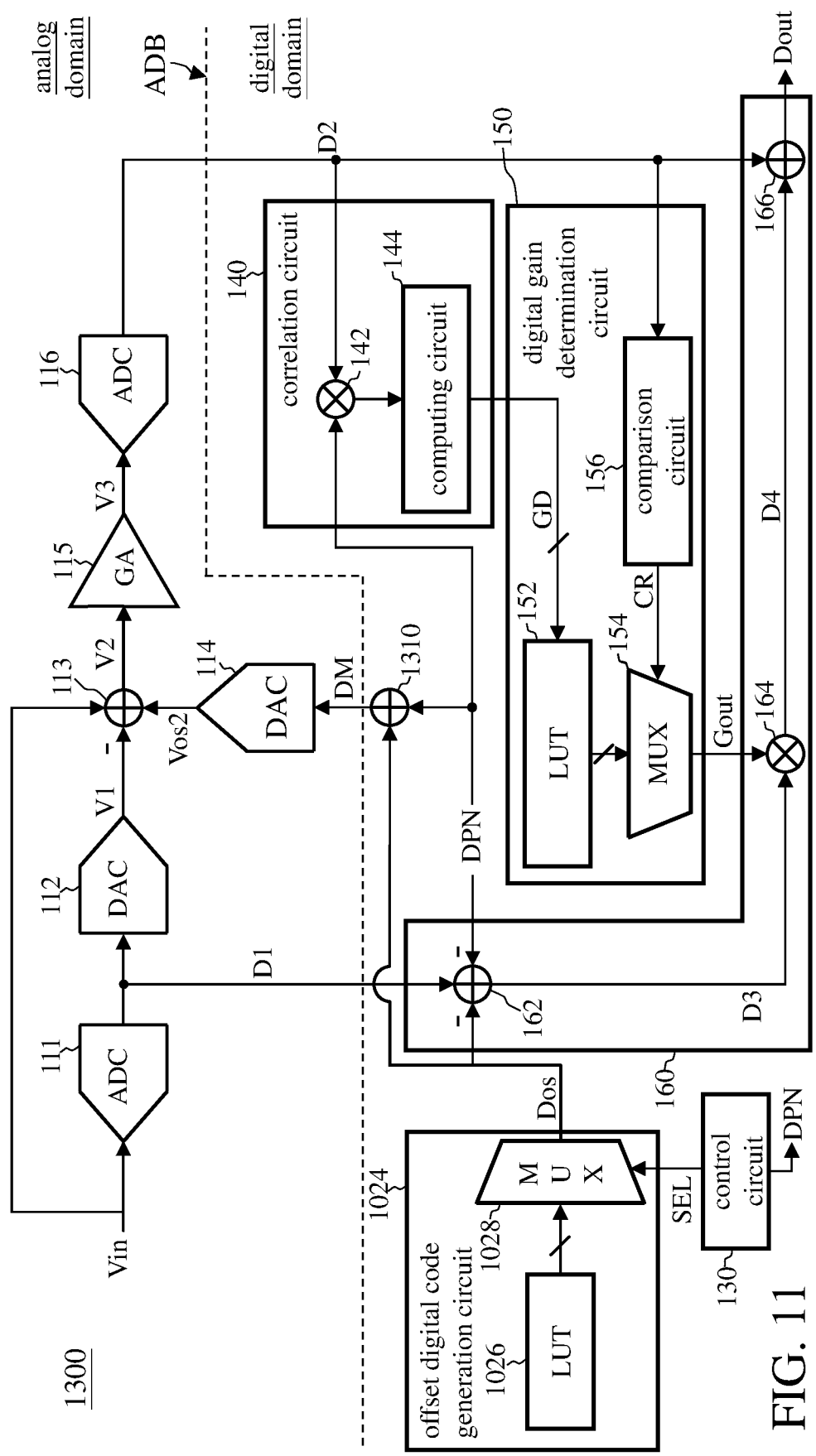
FIG. 11 is a functional block diagram of a pipeline ADC according to another embodiment of the present invention.
Figure 12:
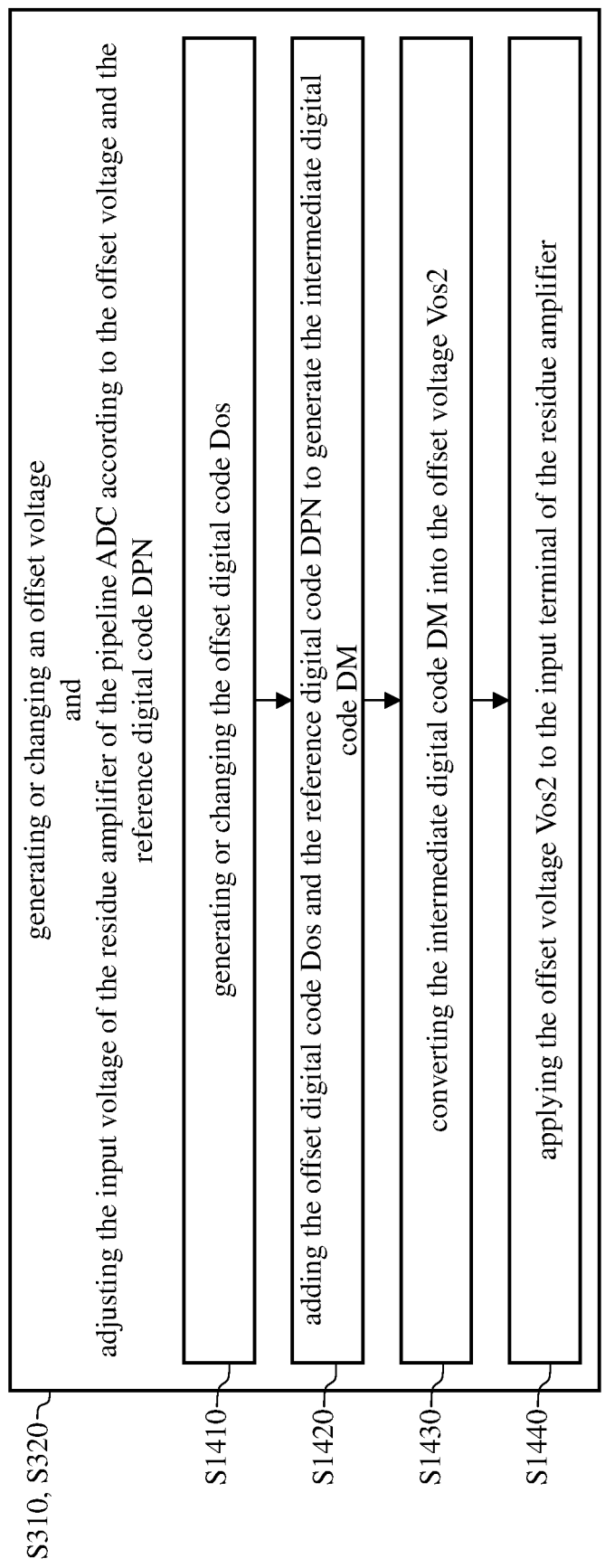
FIG. 12 shows the details of step S310 and step S320 of FIG. 3 according to another embodiment.

FIG. 11 is a functional block diagram of a pipeline ADC according to another embodiment of the present invention. The pipeline ADC 1300 is similar to the pipeline ADC 1000 of FIG. 8, except that the pipeline ADC 1300 of FIG. 11 does not include the DAC 1022 but further includes an adder circuit 1310. The adder circuit 1310 generates an intermediate digital code DM according to the reference digital code DPN and the offset digital code Dos (DM=DPN+Dos). The DAC 114 converts the intermediate digital code DM into an offset voltage Vos2. The adder circuit 113 generates the intermediate voltage V2 according to the input voltage Vin, the intermediate voltage V1, and the offset voltage Vos2 (V2=Vin−V1+Vos2). FIG. 12, which corresponds to the circuit of FIG. 11, shows the details of step S310 and step S320 of FIG. 3 according to another embodiment. Step S310 and step S320 include the following sub-steps.

Step S1410: The offset digital code generation circuit 1024 generates or changes the offset digital code Dos. Similar to the offset voltage generation circuit 120, in some embodiments, the control circuit 130 controls the offset digital code generation circuit 1024 to output a different offset digital code Dos each time the step S1410 is performed.

Step S1420: The adder circuit 1310 adds the offset digital code Dos and the reference digital code DPN to generate the intermediate digital code DM.

Step S1430: The DAC 114 converts the intermediate digital code DM into the offset voltage Vos2.

Step S1440: The offset voltage Vos2 is applied to the input terminal of the residue amplifier 115 through the adder circuit 113.

In summary, in the present invention, the input voltage of the residue amplifier 115 is adjusted (i.e., the residual voltage Vres of FIG. 4 is adjusted) by introducing an offset voltage (Vos, Vos1, or Vos2) into the pipeline ADC, and at the same time, the gain of the residue amplifier 115 corresponding to the residual voltage Vres is estimated to obtain an intermediate gain GD. Moreover, because the digital gain Gout is determined according to the magnitude of the digital code D2 (e.g., depending on the zone of FIG. 4 in which the digital code D2 falls), the digital gain Gout can better match the actual gain of the residue amplifier 115, which is equivalent to calibrating the non-linear characteristic of the gain of the residue amplifier 115, thereby improving the overall linearity of the pipeline ADC. The more zones of FIG. 4 (i.e., the finer the offset voltages), the better the calibration effect.

Note that since most pipeline ADCs are designed with redundancy (to prevent signal clipping), adding an offset voltage to a pipeline ADC will not affect the accuracy of a pipeline ADC if the added offset voltage does not exceed this redundancy.

The control circuit 130 and the computing circuit 144 can be an application specific integrated circuit (ASIC) or can be embodied by circuits or hardware such as a programmable logic device (PLD).

Various functional components or blocks have been described herein. As appreciated by persons skilled in the art, in some embodiments, the functional blocks can preferably be implemented through circuits (either dedicated circuits, or general purpose circuits, which operate under the control of one or more processors and coded instructions), which typically comprise transistors or other circuit elements that are configured in such a way as to control the operation of the circuitry in accordance with the functions and operations described herein. As further appreciated by persons skilled in the art, the specific structure or interconnections of the circuit elements can typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The two-stage pipeline ADC is intended to illustrate the invention by way of example and not to limit the scope of the claimed invention. People having ordinary skill in the art may apply the present invention to a pipeline ADC having more stages in accordance with the foregoing discussions.

Since a person having ordinary skill in the art can appreciate the implementation detail and the modification thereto of the present method invention through the disclosure of the device invention, repeated and redundant description is thus omitted. Please note that the shape, size, and ratio of any element in the disclosed figures are exemplary for understanding, not for limiting the scope of this invention. Furthermore, there is no step sequence limitation for the method inventions as long as the execution of each step is applicable. In some instances, the steps can be performed simultaneously or partially simultaneously.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A pipeline analog-to-digital converter (ADC) comprising:
   an offset voltage generation circuit configured to generate an offset voltage;
   a first ADC configured to generate a first digital code according to an input voltage and the offset voltage;
   a first digital-to-analog converter (DAC) configured to generate a first intermediate voltage according to the first digital code;
   a second DAC configured to generate a reference voltage according to a reference digital code;
   a first adder circuit configured to generate a second intermediate voltage according to the input voltage, the first intermediate voltage, and the reference voltage;
   a residue amplifier configured to amplify the second intermediate voltage to generate a third intermediate voltage;
   a second ADC configured to generate a second digital code according to the third intermediate voltage;
   a correlation circuit configured to generate a plurality of intermediate gains according to the reference digital code and the second digital code;
   a digital gain determination circuit configured to select one of the intermediate gains as a digital gain according to the second digital code; and
   an output circuit configured to generate an output digital code according to the first digital code, the reference digital code, the second digital code, and the digital gain.

2. The pipeline ADC of claim 1, wherein the reference digital code is a pseudo-random number.

3. The pipeline ADC of claim 1 further comprising:
   a control circuit coupled to the offset voltage generation circuit and configured to control the offset voltage generation circuit to generate or change the offset voltage;
   wherein the intermediate gains vary with the offset voltage.

4. The pipeline ADC of claim 1, wherein the output circuit comprises:
   a second adder circuit configured to generate a third digital code according to the first digital code and the reference digital code;
   a multiplication circuit configured to multiply the third digital code by the digital gain to generate a fourth digital code; and
   a third adder circuit configured to generate the output digital code according to the second digital code and the fourth digital code.

5. The pipeline ADC of claim 1, wherein the digital gain determination circuit comprises:
   a comparison circuit configured to compare the second digital code with a plurality of threshold values to generate a comparison result; and a selection circuit coupled to the comparison circuit and configured to select one of the intermediate gains as the digital gain according to the comparison result.

6. A pipeline analog-to-digital converter (ADC), comprising:
- an offset digital code generation circuit configured to generate an offset digital code;
- a first ADC configured to generate a first digital code according to an input voltage;
- a first digital-to-analog converter (DAC) configured to generate a first intermediate voltage according to the first digital code;
- a second DAC configured to generate an offset voltage according to a reference digital code and the offset digital code;
- a first adder circuit configured to generate a second intermediate voltage according to the input voltage, the first intermediate voltage, and the offset voltage;
- a residue amplifier configured to amplify the second intermediate voltage to generate a third intermediate voltage;
- a second ADC configured to generate a second digital code according to the third intermediate voltage;
- a correlation circuit configured to generate a plurality of intermediate gains according to the reference digital code and the second digital code;
- a digital gain determination circuit configured to select one of the intermediate gains as a digital gain according to the second digital code; and
- an output circuit configured to generate an output digital code according to the first digital code, the reference digital code, the offset digital code, the second digital code, and the digital gain.

7. The pipeline ADC of claim 6, wherein the reference digital code is a pseudo-random number.

8. The pipeline ADC of claim 6 further comprising:
- a control circuit coupled to the offset digital code generation circuit and configured to control the offset digital code generation circuit to generate or change the offset digital code;
- wherein the intermediate gains vary with the offset voltage.

9. The pipeline ADC of claim 6, wherein the output circuit comprises:
- a second adder circuit configured to generate a third digital code according to the first digital code, the offset digital code, and the reference digital code;
- a multiplication circuit configured to multiply the third digital code by the digital gain to generate a fourth digital code; and
- a third adder circuit configured to generate the output digital code according to the second digital code and the fourth digital code.

10. The pipeline ADC of claim 6, wherein the digital gain determination circuit comprises:
- a comparison circuit configured to compare the second digital code with a plurality of threshold values to generate a comparison result; and
- a selection circuit coupled to the comparison circuit and configured to select one of the intermediate gains as the digital gain according to the comparison result.

11. A method of calibrating a pipeline analog-to-digital converter (ADC) that comprises a residue amplifier, the method comprising:
- (A) generating an offset voltage;
- (B) adjusting a first input voltage of the residue amplifier according to the offset voltage and a reference digital code;
- (C) converting an output voltage of the residue amplifier into a second digital code;
- (D) performing a correlation operation on the reference digital code and the second digital code to generate an intermediate gain;
- (E) recording the intermediate gain;
- (F) repeating steps (A) to (E) to record a plurality of intermediate gains;
- (G) selecting one of the intermediate gains as a digital gain according to the second digital code; and
- (H) generating an output digital code according to a first digital code, the reference digital code, the digital gain, and the second digital code.

12. The method of claim 11, wherein the reference digital code is a pseudo-random number.

13. The method of claim 11, wherein the offset voltage is changed each time step (B) is performed.

14. The method of claim 13, wherein step (B) comprises:
- (B1) applying the offset voltage to an ADC that generates the first digital code according to the offset voltage and a second input voltage of the pipeline ADC;
- (B2) converting the first digital code into an intermediate voltage;
- (B3) converting the reference digital code into a reference voltage; and
- (B4) applying the intermediate voltage and the reference voltage to an input terminal of the residue amplifier.

15. The method of claim 13, wherein step (A) comprises:
- (A1) generating an offset digital code; and
- (A2) converting the offset digital code to the offset voltage.

16. The method of claim 13, wherein step (B) comprises:
- (B1) converting the reference digital code into a reference voltage; and
- (B2) applying the offset voltage and the reference voltage to an input terminal of the residue amplifier.

17. The method of claim 13, wherein step (A) and step (B) comprise:
- (A1) generating an offset digital code;
- (A2) adding the offset digital code to the reference digital code to generate an intermediate digital code;
- (A3) converting the intermediate digital code to the offset voltage; and
- (A4) applying the offset voltage to an input terminal of the residue amplifier.

18. The method of claim 13, wherein step (H) comprises:
- (H1) generating a third digital code according to the first digital code and the reference digital code;
- (H2) generating a fourth digital code according to the third digital code and the digital gain;
- (H3) generating the output digital code according to the fourth digital code and the second digital code.

* * * * *